(12) United States Patent
McGillivray et al.

(10) Patent No.: US 9,277,643 B2
(45) Date of Patent: Mar. 1, 2016

(54) S-SHAPED CERAMIC FEEDTHROUGH

(71) Applicant: Ametek Aegis, New Bedford, MA (US)

(72) Inventors: Kenneth G. McGillivray, Lake Forest, CA (US); Ricky Lee Sturdivant, Placentia, CA (US)

(73) Assignee: Ametek Aegis, New Bedford, MA (US)

( * ) Notice: Subject to any disclaimer, the term of this patent is extended or adjusted under 35 U.S.C. 154(b) by 0 days.

(21) Appl. No.: 14/323,046

(22) Filed: Jul. 3, 2014

(65) Prior Publication Data

US 2016/0007448 A1 Jan. 7, 2016

(51) Int. Cl.
| | |
|---|---|
| *H01L 21/48* | (2006.01) |
| *H01L 21/02* | (2006.01) |
| *H05K 1/02* | (2006.01) |
| *H05K 1/03* | (2006.01) |
| *H05K 1/11* | (2006.01) |
| *H05K 3/40* | (2006.01) |

(52) U.S. Cl.
CPC ............ *H05K 1/0284* (2013.01); *H05K 1/0306* (2013.01); *H05K 1/115* (2013.01); *H05K 3/4038* (2013.01); *H05K 2201/09018* (2013.01); *H05K 2201/10287* (2013.01)

(58) Field of Classification Search
CPC ... H05K 1/0284; H05K 1/115; H05K 1/0306; H05K 3/4038; H05K 2201/09018; H05K 2201/10287
See application file for complete search history.

(56) References Cited

U.S. PATENT DOCUMENTS

| | | | |
|---|---|---|---|
| 4,912,547 A | 3/1990 | Bilowith et al. | |
| 5,028,473 A | 7/1991 | Vitriol et al. | |
| 5,426,405 A | 6/1995 | Miller et al. | |
| 5,943,212 A * | 8/1999 | Horiuchi | H01L 23/49816 |
| | | | 174/252 |
| 6,239,384 B1 | 5/2001 | Smith et al. | |
| 6,509,531 B2 | 1/2003 | Sakai et al. | |
| 6,933,450 B2 | 8/2005 | Okumichi et al. | |

OTHER PUBLICATIONS

PCT/US15/34114, Invitation to Pay Additional Fees and, Where Applicable, Protest Fee, Aug. 19, 2015.
PCT/US15/34114, Notification of Transmittal of the International Search Report and the Written Opinion of the International Searching Authority, or the Declaration, Oct. 26, 2015.

* cited by examiner

*Primary Examiner* — Ermias Woldegeorgis
(74) *Attorney, Agent, or Firm* — Wiggin and Dana LLP; Gregory S. Rosenblatt

(57) ABSTRACT

An electrical interconnect has a non-planar ceramic substrate with opposing first and second ends. A first conductive layer having first and second opposing sides is disposed within the ceramic substrate with one of the first and second opposing sides exposed at the first end and one of the first and second opposing sides exposed at the second end. The electrical interconnect is useful to join an integrated circuit in a hybrid package to a circuit board in high frequency communication applications.

15 Claims, 7 Drawing Sheets

S-SHAPED CERAMIC FEEDTHROUGH

BACKGROUND

1. Field

The disclosure relates to a ceramic feedthrough for use in a high frequency signal transmission device. More particularly, a stripline transmission line is surrounded by a ceramic portion. This ceramic portion is then covered with a ground metallization.

2. Description of the Related Art

High frequency electronic packages are frequently hybrid packages containing a multiple devices. The hybrid package is solder attached to a circuit board for use in high data rate communication systems. A number of requirements are imposed on an interconnect that joins the hybrid package to the circuit board. First, the interconnect must be capable of transitioning the electrical signal from the location of integrated circuits inside the housing of the hybrid package to lower levels that make contact with the circuit board. The signal path from the integrated circuits to the circuit board must simultaneously provide good signal integrity, solderable connection to the circuit board and transverse the requisite distance.

Second, the hybrid packages require electrical interconnects with performance that is effective over a very wide frequency bandwidth, nominally from 0 to 50 GHz or even 80 GHz. This wide band performance is required to maintain signal integrity of the information carried along the electrical interconnects. If the signal integrity is not maintained, then the information carried along the electrical interconnects will become unusable and the information could be lost.

Third, the interconnects must be compatible with the solder used to attach to circuit boards using standard surface mount methods. Solder attach is important because it offers the board level system integrator flexibility in processes and a capability to use low cost manufacturing processes.

To demonstrate the importance of signal integrity, consider the effect of poorly performing interconnects. The effect may be illustrated by eye performance results from the signal passing through the electrical interconnect. In telecommunications, an eye diagram is an oscilloscope display that shows a digital data signal that is repetitively sampled. It is called an eye diagram because, for several types of coding, the pattern looks like a series of eyes between a pair of rails. It is an empirical method used for the evaluation of combined effects. It is commonly used for high speed communication signals as an indication of the quality of the signal. For interconnects, the eye diagram shows undesired effects within the interconnects that will degrade the signal performance.

Several signal performance measures can be derived by analyzing the eye diagram. If the signals are too long, too short, poorly synchronized with the system clock, too high, too low, too noisy, too slow to change, or have too much undershoot or overshoot, this can be observed from an eye diagram. An open eye pattern corresponds to minimal signal distortion. Distortion of the signal waveform due to intersymbol interference and noise appears as closure of the eye pattern. An exemplary eye diagram with good performance is illustrated in FIG. 1. The eye 2 has symmetry and is uniform in shape.

The eye diagram illustrated in FIG. 2 shows the effect of transmission line dispersion, an electrical interconnect effect that degrades eye performance. Dispersion causes the transmission line propagation constant to be non-linear with frequency and line impedance to change as a function of frequency. The eye 4 lacks symmetry and is not uniform in shape. Other effects that degrade eye diagram performance include a stray inductive or capacitive parasitic as part of the electrical interconnect.

One prior high speed interconnect is a metal box with high quality coaxial connectors. The connectors are approximately 0.5 inch×0.5 inch×0.25 inch and require coaxial cable for connection. While these connections are capable of providing high quality interconnect performance over a very broad frequency range, they are not surface mountable. The connectors are too large to effectively integrate with a compact telecommunications equipment box.

A high speed interconnect is disclosed in U.S. Pat. No. 8,933,450, titled "High-Frequency Transmitting Device," by Okumichi et al., that is incorporated by reference herein in its entirety. FIGS. 1A-1D of U.S. Pat. No. 8,933,450 illustrate a microstrip or coplanar waveguide transmission line forming a vertical transition from a top layer to a bottom layer. This approach utilizes a coaxial section that allows transition of the electrical signal from a layer with integrated circuits down to a layer that contacts with a circuit board. The coaxial section is formed using a center conductor via and a series of vias that form an electrical ground contact. This permits the signal to travel over transmission lines that are matched or nearly matched to the required system impedance, that is normally 50 ohms. A drawback with this approach is that it requires the electrical system to make an abrupt 90° bend in at least two locations which degrades electrical performance. The 90° bends occur at transition points at the top and at the bottom of the ceramic stack. One attempt at addressing this drawback is to use a stair-stepped via structure as mention in U.S. Pat. No. 8,933,450. This approach adds additional transition discontinuities which must be compensated and degrade electrical performance. Another drawback is that it requires a transition from co-planar waveguide (CPW), or microstrip, transmission line to coaxial transmission at two locations. This transition further degrades the electrical performance because the electric field distributions are so different between horizontal CPW or microstrip and the vertical coaxial line.

BRIEF SUMMARY OF THE DISCLOSURE

An electrical interconnect has a non-planar ceramic substrate with opposing first and second ends. A first conductive layer having first and second opposing sides is disposed within the ceramic substrate with one of the first and second opposing sides exposed at the first end and one of the first and second opposing sides exposed at the second end. The electrical interconnect is useful to join an integrated circuit in a hybrid package to a circuit board in high frequency communication applications.

BRIEF DESCRIPTION OF THE DRAWINGS

Like reference numbers and designations in the various drawings indicated like elements.

DETAILED DESCRIPTION

Figure 1:
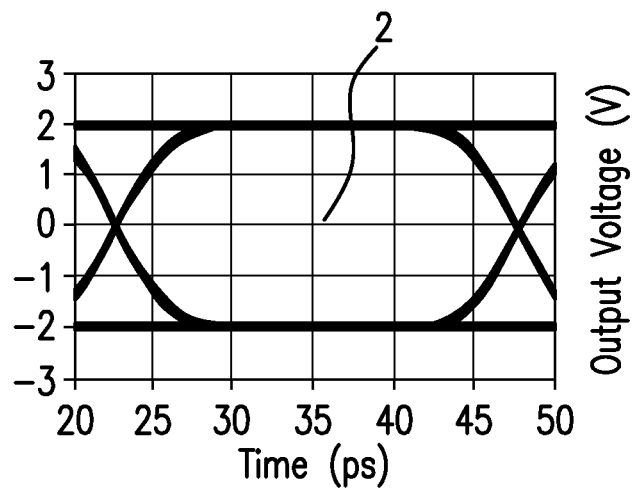
FIG. 1 is an eye diagram illustrating good performance by an electrical interconnect.
Figure 2:
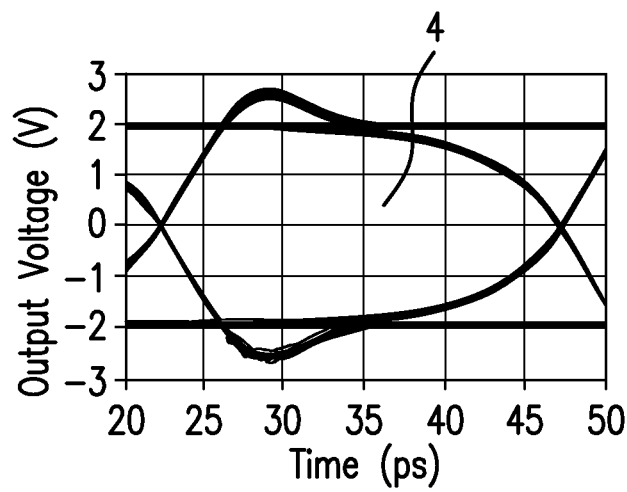
FIG. 2 is an eye diagram illustrating poor performance by an electrical interconnect.
Figure 3:
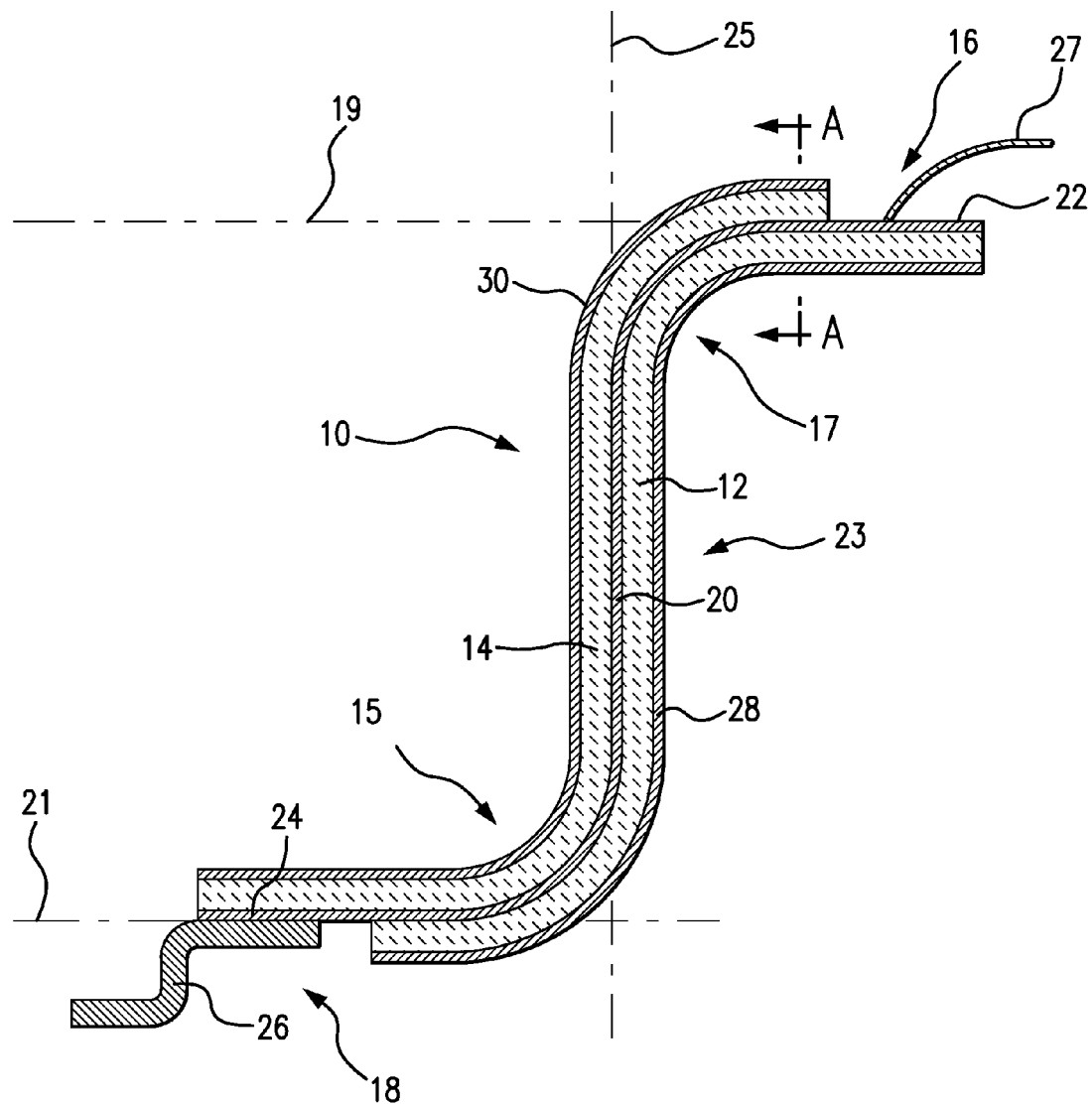
FIG. 3 is a cross-sectional view of an S-shaped ceramic feedthrough as disclosed herein.

An electrical interconnect with the exemplary shape of an S-shaped ceramic feedthrough 10 is illustrated in cross-sectional representation in FIG. 3. The S-shaped ceramic feedthrough 10 has a non-planar ceramic substrate portion that provides structural support. This ceramic portion includes a first layer 12 and a second layer 14 fused together as described hereinbelow. The fused first layer 12 and second layer 14 are S-shaped, with a first radius of curvature 15 about equal to a second radius of curvature 17, to smoothly transition an electrical signal from a package connect portion 16 to a board connect portion 18. Disposed between the first layer 12 and the second layer 14 is an electrically conductive stripline 20. A first microstrip 22 extends from stripline 20 and is supported by the package connect portion 16 of the first layer 12 and is for electrical interconnection to integrated circuits contained in a hybrid package, such as by wire bonding 27. An opposing second microstrip 24 extends from stripline 20 and is supported by the board connect portion 18 of the second layer 14 and is for electrical interconnection to a circuit board or similar structure. The first microstrip 22 and the second microstrip 24 are essentially co-planar as indicated by projection lines 19, 21 and approximately perpendicular to mid-portion 23 as indicated by projection line 25. A metallic lead 26 or a solder ball (not shown) may facilitate electrical interconnection between the second microstrip 24 and the circuit board. A ground metallization 28, 30 coats exterior surfaces of the fused first layer 12 and second layer 14 of the ceramic section.

The first microstrip 22 is supported by the first layer 12 of the ceramic portion. This provides a rigid surface for wirebonding to integrated circuits within the hybrid package housing. The ground metallization 28, 30 provides isolation to minimize electrical signal radiation to other circuits and provides a ground reference for the transmission lines. The ground metallization 28, 30 also provides a surface for brazing to the metal housing of the hybrid package which results in a hermetic seal. The shaped lead 26 at the second microstrip 24 of the S-shaped ceramic feedthrough 10 provides a solderable surface for connection to a circuit board and a stress relief between the ceramic-based feedthrough 10 and, for example, a polymer-based printed circuit board. The first microstrip 22 is a matched transmission line with an electric field that is compatible with the stripline 20 and in the same plane, due to the smooth transition bend.

Particularly beneficial is the way that the high speed electrical path transitions from the microstrip level 22 to the circuit board connection point 24. The transition is implemented based on the use of a stripline transmission line. The transmission line is one continuous piece of stripline in ceramic that is formed, prior to final ceramic firing, into the shape required to transport the electrical signal. In this way, the transition avoids the use of vertical vias and abrupt signal transitions that are characteristic of some prior implementations.

Figure 6:
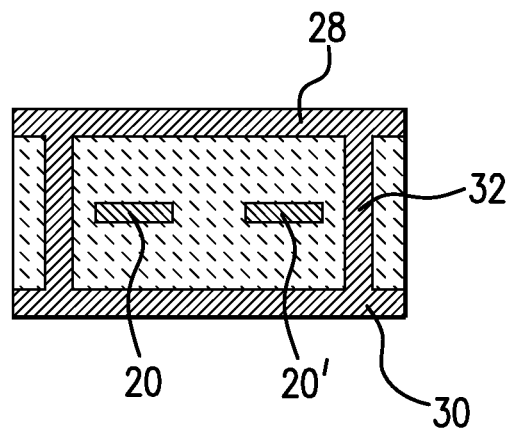
FIG. 6 is a sectional view of a third embodiment of the S-shaped ceramic feedthrough of FIG. 3.

The first microstrip 22 has a section of microstrip line that makes contact to integrated circuits. The second microstrip 24 has an attached lead 26 that makes contact between a circuit board and the S-shaped ceramic feedthrough 10. Disposed between the first microstrip 22 and the second microstrip 24 is a section of continuous stripline transmission line 20 that is formed into the required shape. Because cofired ceramic material is not rigid and is formable prior to final firing, the ceramic feedthrough can be bent into a desired shape to realize the transition. All of the transmission lines are optimized for 50 ohms, or other required system impedance, so that the electrical signal maintains high quality. The ceramic that surrounds the stripline transmission line section 20 is covered with ground metallization. With reference to FIG. 6, there may be vias 32 connecting the ground metallization 28 on the top side with the ground metallization 30 on the bottom side. The vias 32 contact the ground metallization 28, 30 that is on the top side and on the bottom side of the ceramic. The vias 32 are useful because they maintain electrical connection between the ground metallizations 28, 30 to avoid higher mode propagation.

Figure 4:
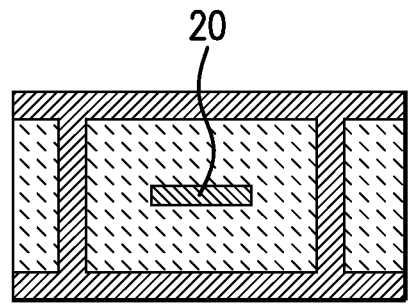
FIG. 4 is a sectional view of a first embodiment of the S-shaped ceramic feedthrough of FIG. 3.
Figure 5:
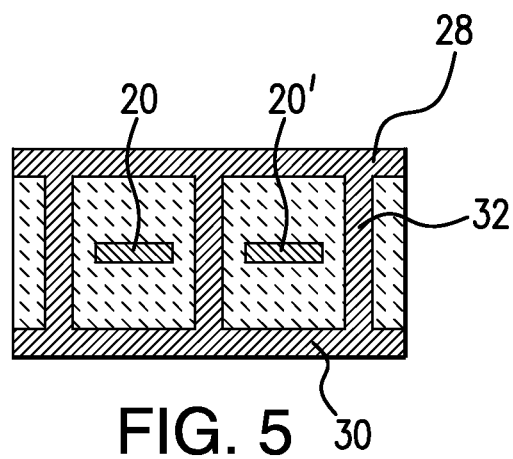
FIG. 5 is a sectional view of a second embodiment of the S-shaped ceramic feedthrough of FIG. 3.

The transmission stripline 20 within the S-shaped ceramic feedthrough may be multiple transmission lines or coupled transmission lines. FIGS. 4-6 show the ceramic feed through in cross-sectional view along the reference line (A-A) in FIG. 3. FIG. 4 illustrates a single stripline 20. FIG. 5 illustrates two striplines 20, 20'. When there are multiple transmission lines, the vias 32 contacting the top metallization 28 and the bottom metallization 30 have the additional function of providing electrical signal isolation between the separate transmission striplines 20, 20'. Undesired coupling between circuits occurs when there is capacitive or inductive energy transfer and can have a detrimental effect on signal integrity. At lower frequencies, coupling between transmission lines is treated as an effect that is linear with frequency and with the length of the line. At lower frequencies, this is a perfectly valid approach to within a few percent for many transmission lines. A more accurate approach is to approximate the coupled lines as a capacitance that is proportional to the length of the transmission lines. However, as frequency increases, the coupling between transmission lines can no longer be approximated by linear function or modeled with a simple capacitor, instead, they are modeled as coupled transmission lines. When the coupling is undesired, then the isolation vias 32 between the transmission striplines 20, 20' eliminates (or minimizes) the capacitive coupling between transmission lines. Although only two transmission striplines are shown in FIG. 5, it is possible for in excess of two transmission striplines to be within the same structure, either side by side or stacked within the ceramic.

Figure 7:
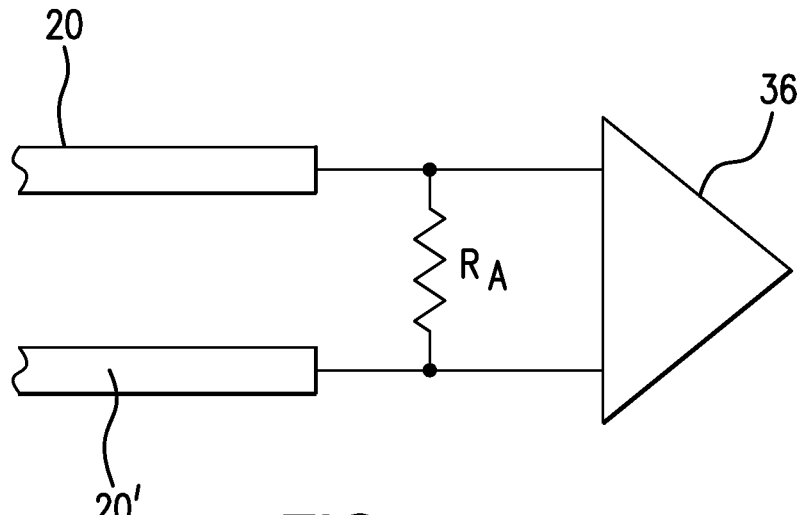
FIG. 7 schematically illustrates coupled transmission lines for use with a first amplifier circuit.

An alternative, illustrated in FIG. 6, is coupled transmission striplines 20, 20'. Coupled transmission striplines are useful in certain applications that require coupled differential transmission lines to maintain signal integrity. There are many reasons that coupled transmission lines are used. One example is when the transmission striplines 20, 20' terminate into amplifiers 36 that require differential signals. One method to model the coupled striplines 20, 20' is to use even and odd mode impedances. The ceramic transition can be used to realize coupled transmission lines 20, 20' that are important for these types of circuits. With reference to FIG. 7:

$$Z_{even} = \infty$$

Figure 8:
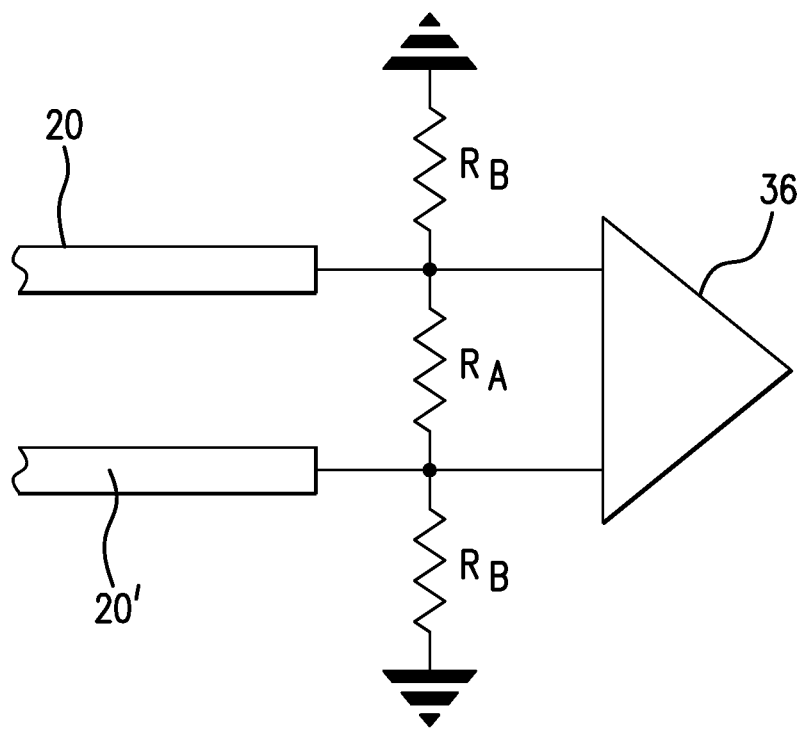
FIG. 8 schematically illustrates coupled transmission lines for use with a second amplifier circuit.

With reference to FIG. 8:

(1) even mode impedance matching $$R_B = Z_{even}$$

(2) odd mode impedance matching $$R_B \| R_A/2 = Z_{odd}$$

$$(Z_{even} \cdot R_A)/(2Z_{even} + R_A) = Z_{odd}$$

$$\therefore R_A = (2Z_{even} \cdot Z_{odd})/(Z_{even} - Z_{odd})$$

Figure 9:
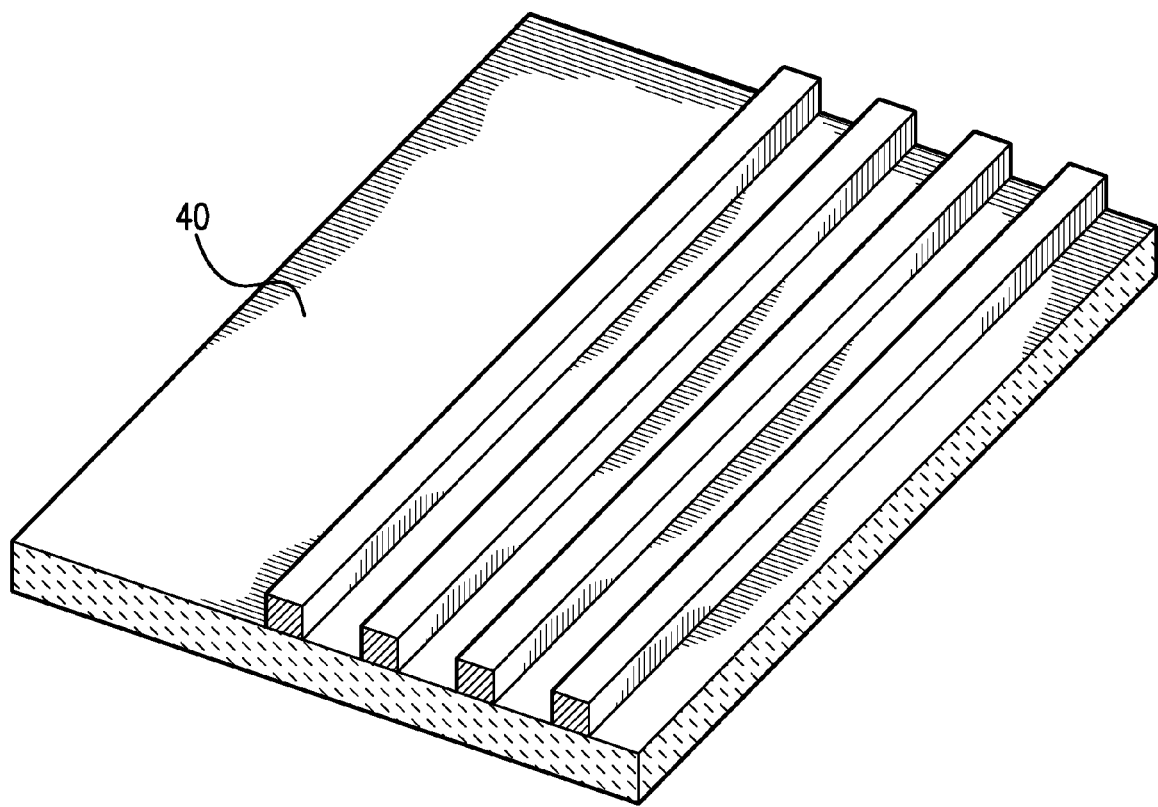
FIG. 9 shows a first process step used for the manufacture of the S-shaped ceramic feedthrough of FIG. 3.

FIG. 9 shows a first process step used for the manufacture of the S-shaped ceramic feedthrough. A first ceramic substrate 40 is a green compact of a ceramic material. A green compact means that the ceramic has been pressed together, but has not yet been fired. It is therefore flexible and may be formed without falling apart. A suitable ceramic is characterized by its ability to support the mechanical demands, ability to be formed in the green (unfired) state, ability to be fired (sintered) into a homogeneous (or nearly homogeneous) piece, and its compatibility for high frequency electrical signal transport which includes appropriate dielectric constant. One suitable ceramic has a composition, by weight, of 90%-95% aluminum oxide (High Temperature Cofired Ceramic technology). However, other glass and ceramic composition may be used (i.e. Low Temperature Cofired Ceramic technology). Conductive striplines 42 are placed on the first ceramic substrate. The number of striplines 42 and their spacing is dependent of the lead configuration of the finished feedthrough.

Figure 10:
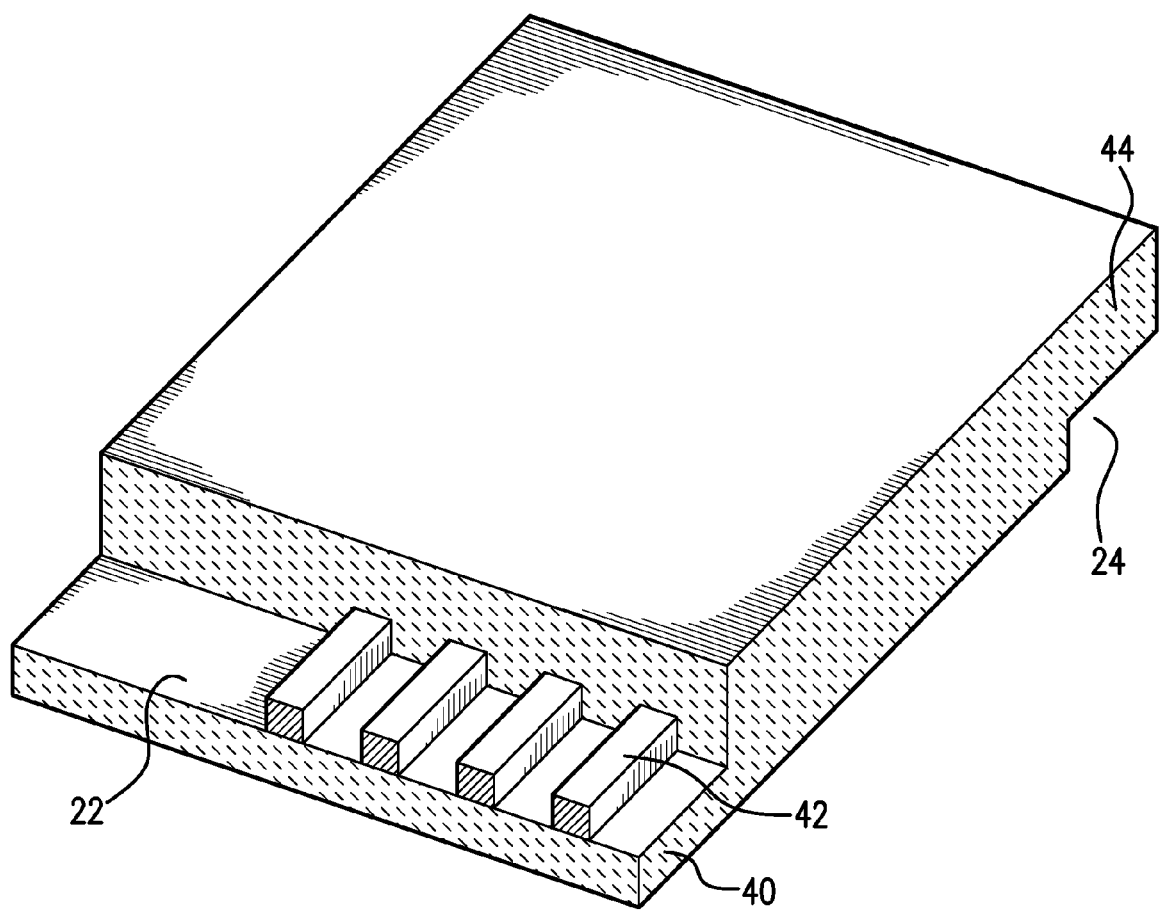
FIG. 10 shows a second process step used for the manufacture of the S-shaped ceramic feedthrough of FIG. 3.

As a second process step, as shown in FIG. 10, A second ceramic substrate 44, also a green compact of the ceramic material is placed over the striplines 42 and pressed to abut the first ceramic substrate 40. The first 40 and second 44 ceramic substrates are sized and aligned to form the respective first microstrip 22 and second microstrip 24 (as seen in FIG. 3).

Figure 11:
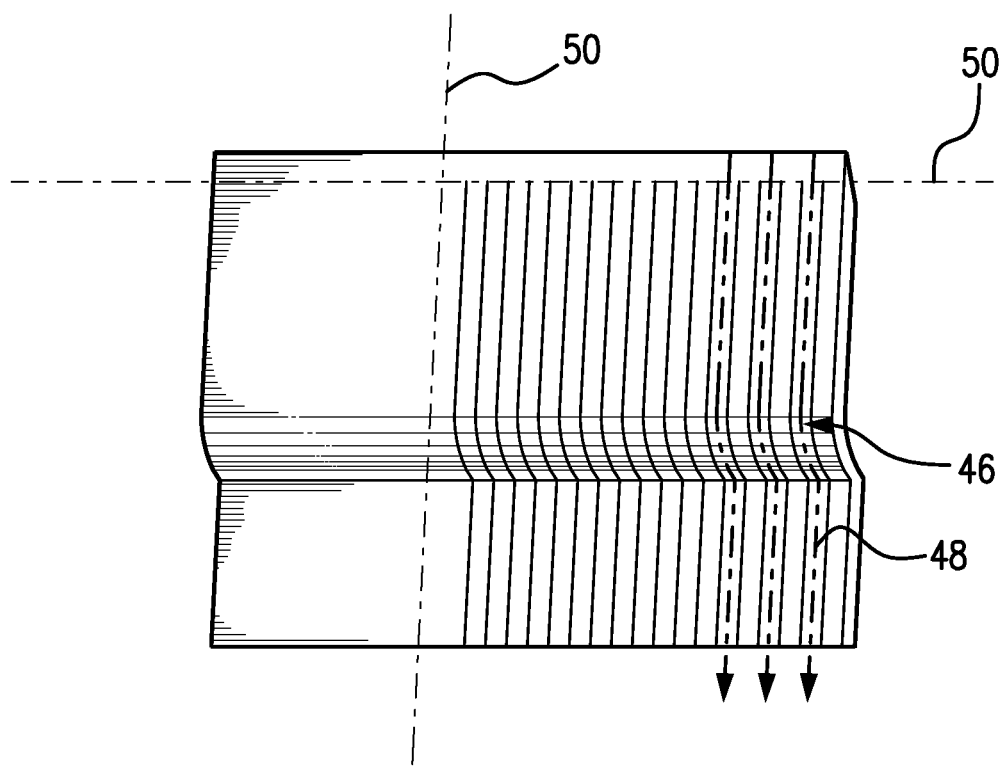
FIG. 11 shows a third process step used for the manufacture of the S-shaped ceramic feedthrough of FIG. 3.

As a third process step, as shown in FIG. 11, The structure formed by the combination of the first ceramic substrate and the second ceramic substrate is placed in a mold and formed to a desired shape with transition 46 having appropriate curves at top and bottom and mid-portion of a desired length. Because the ceramic substrates are green compacts at this point, accurate control over curves and lengths is readily achieved. The structure is then fired to fused the ceramic components. A typical heat cycle for sintering a High Temperature Cofired Ceramic is heating to a temperature of from 1400° C. to 1600° C. for a time of from 30 minutes to 6 hours in a hydrogen-nitrogen (reducing) atmosphere or in a vacuum and then cooling to room temperature. A typical heat cycle for sintering a Low Temperature Cofired Ceramic is heating to a temperature of from 400° C. to 850° C. in an air (oxidizing) atmosphere or a time of from 10 minutes to one hour and then cooling back to room temperature. The fused structure is then sanded and polished along the direction of arrows 48 and then cut along lines 50 to complete the S-shaped ceramic feedthrough.

One or more embodiments of the present invention have been described. Nevertheless, it will be understood that various modifications may be made without departing from the spirit and scope of the invention. For example, the ceramic piece may be bent upward from the package to form a transition that makes contact to a motherboard on the opposite side of the package. This approach is useful in cases where the thermal path of the electronics and the electronic signal path are on opposite sides of the package. Another example is where the electrical signal will transition from one layer of the metal package to a separate signal layer within the package. In this modification to the invention, the transition allows high quality signal transmission within a metal package when the electronics inside the package are at different levels. Another modification is when the transition is used to transition to the external portion of the metal package, but rather than at the edge of the package, the transition can occur at an internal portion of the package allowing the external signal to exit the package without extending the package foot print. This approach may be useful in cases where a very compact package size is required. Accordingly, other embodiments are within the scope of the following claims.

What is claimed is:

1. An electrical interconnect, comprising:
a non-planar ceramic substrate having coplanar opposing first and second ends with opposing first and second surfaces of the non-planar ceramic substrate coated with respective first and second conductive material;
a first conductive layer having first and second opposing sides disposed within the ceramic substrate with one of said first and second opposing sides exposed at said first end and one of said first and second opposing sides exposed at said second end;
one or more additional conductive layers, that are coplanar with said first conductive layer disposed within the ceramic substrate each of said one or more additional conductive layers also having one of a first and a second opposing sides exposed at said first end and one of said first and said second opposing sides exposed at said second end; and
a plurality of electrically conductive vias extending from said first conductive material to said second conductive such that an electrically conductive via extends along two opposing edges of each of said conductive layer and said one of more additional conductive layers.

2. The electrical interconnect of claim 1 wherein a mid-portion of said non-planar ceramic substrate is approximately perpendicular to both said first end and said second end.

3. An electrical interconnect, comprising:
a non-planar ceramic substrate having coplanar opposing first and second ends with opposing first and second surfaces of the non-planar ceramic substrate coated with respective first and second conductive material;
a first conductive layer having first and second opposing sides disposed within the ceramic substrate with one of said first and second opposing sides exposed at said first end and one of said first and second opposing sides exposed at said second end;
one or more additional conductive layers, that are coplanar with said first conductive layer disposed within the ceramic substrate each of said one or more additional conductive layers also having one of a first and a second opposing sides exposed at said first end and one of said first and said second opposing sides exposed at said second end; and
a plurality of electrically conductive vias extending from said first conductive material to said second conductive material such that an electrically conductive via extends along one edge of said conductive layer and one edge of one of said one of more additional conductive layers with no electrically conductive via disposed between said conductive layer and an adjacent one of said one of more additional conductive layers.

4. An electrical interconnect, comprising:
a non-planar ceramic substrate having coplanar opposing first and second ends with opposing first and second surfaces of the non-planar ceramic substrate coated with respective first and second conductive material;
a first conductive layer having first and second opposing sides disposed within the ceramic substrate with said first side exposed at said first end and said second opposing side exposed at said opposing second end;

one or more additional conductive layers, that are coplanar with said first conductive layer disposed within the ceramic substrate each of said one or more additional conductive layers also having a first side exposed at said first end and a second opposing side exposed at said second end; and an electrical interconnection effective to electrically interconnect said electrical conductor to an integrated circuit bonded to said first opposing side of said first conductive layer.

5. A process for the manufacture of the electrical interconnect of claim 4, comprising the steps of:

a) providing a first green ceramic compact and disposing a plurality of electrically conductive strips on said green ceramic compact, said plurality of electrically conductive strips being parallel to each other and electrically isolated from each other;

b) placing a second green ceramic compact on to a surface of said first green ceramic compact with said plurality of electrically conductive strips disposed there between with one of a first opposing side of said plurality of electrically conductive strips being supported by said first green ceramic compact and not covered by said second green ceramic compact and a second opposing side of said plurality of electrically conductive strips being supported by said second green compact and not covered by said first green compact;

c) shaping an assembly formed in step (b) to a desired shape; and d) heating said assembly to a temperature and for a time effective to fuse said first green compact to said second green compact.

6. The process of claim 5 including, prior to step (d), depositing a first metallic layer on an exterior surface of said first and a second metallic layer on an exterior surface of said second green compact.

7. The process of claim 6 including forming one or more electrically conductive vias to extend from said first metallic layer to said second metallic layer.

8. The process of claim 6 including, in step (c), shaping said assembly such that said first opposing side of said plurality of electrically conductive strips is coplanar with said second opposing side of said plurality of electrically conductive strips.

9. The process of claim 8 including, in step (c), shaping said assembly such that a mid-portion of said plurality of electrically conductive strips is approximately perpendicular to said first opposing side of said plurality of electrically conductive strips is coplanar with said second opposing side of said plurality of electrically conductive strips.

10. The process of claim 9 including, in step (c), shaping said assembly such that a radius of curvature between said mid-portion of said plurality of electrically conductive strips and said first opposing side of said plurality of electrically conductive strips is approximately equal to a radius of curvature between said mid-portion of said electrically conductive strips and said second opposing side of said plurality of electrically conductive strips.

11. The electrical interconnect of claim 4 wherein a conductive material effective to electrically interconnect said electrical conductor to a circuit board is bonded to said second opposing side of said first conductive layer.

12. The electrical interconnect of claim 11 wherein a radius of curvature between said first end and said mid-portion of said non-planar ceramic substrate is about equal to a radius of curvature between said mid-portion and said second end of said non-planar ceramic substrate.

13. The process of claim 6 wherein said heating step includes heating to a temperature of between 1400° C. and 1600° C. for a time of between 30 minutes and 6 hours in a reducing atmosphere.

14. The process of claim 6 wherein said heating step includes heating to a temperature of between 400° C. and 850° C. for a time of between 10 minutes and one hour in an oxidizing atmosphere.

15. The electrical interconnect of claim 4 wherein the electrical interconnection is a wire bond.

\* \* \* \* \*